US006442378B1

United States Patent
Aboukhalil et al.

(10) Patent No.: US 6,442,378 B1
(45) Date of Patent: Aug. 27, 2002

(54) POWER LEVEL DETERMINATION DEVICE IN AN RF BOOSTER FOR WIRELESS COMMUNICATIONS

(75) Inventors: Joseph Aboukhalil, Franklin Park; Boris Aleiner, Somerset; Boris Bark, Ocean Township, all of NJ (US)

(73) Assignee: Avaya Technology Corp, Miami Lakes, FL (US)

( * ) Notice: Subject to any disclaimer, the term of this patent is extended or adjusted under 35 U.S.C. 154(b) by 0 days.

(21) Appl. No.: 09/116,110

(22) Filed: Jul. 15, 1998

(51) Int. Cl.[7] .......................... H03C 1/62; H04B 17/00; H04B 1/38; H03M 1/36
(52) U.S. Cl. .................... 455/115; 455/127; 455/226.2; 455/226.4; 455/226.1; 455/571; 455/67.1; 341/159; 341/160; 375/340
(58) Field of Search .......................... 455/226.1, 226.2, 455/226.4, 115, 127, 571, 67.1; 341/159, 158, 160, 132; 375/287, 340, 342, 237, 338, 339, 353

(56) References Cited

U.S. PATENT DOCUMENTS

| | | | | |
|---|---|---|---|---|
| 4,926,180 A | * | 5/1990 | Anastassiou | 341/159 |
| 5,502,746 A | * | 3/1996 | Ozgue | 327/61 |
| 5,623,321 A | | 4/1997 | Harsanyi | 348/730 |
| 5,640,691 A | | 6/1997 | Davis et al. | 455/126 |
| 5,659,253 A | | 8/1997 | Busking | 324/648 |
| 5,678,209 A | | 10/1997 | Strakovsky | 455/126 |
| 5,726,566 A | | 3/1998 | Quist et al. | 324/95 |
| 5,748,681 A | | 5/1998 | Comino et al. | 375/319 |
| 5,869,986 A | * | 2/1999 | Haque et al. | 375/317 |

OTHER PUBLICATIONS

Article "Acronym Guide" from The International Engineering Consortium, May 7, 1998.

(List continued on next page.)

Primary Examiner—Dwayne D. Bost
Assistant Examiner—Raymond Persino
(74) Attorney, Agent, or Firm—Duane Morris & Heckscher LLP; Steven E. Koffs

(57) ABSTRACT

A power level determination device provides an output voltage usable as a specific reference power level corresponding to each RF input power level. The device includes a peak detector, which detects a pulse-type signal at its input and provides a non-pulse-type signal at its output. N comparators are provided, where N is an integer. Each of the N comparators has an output, a first input coupled to the output of the peak detector, and a second input coupled to a respectively different threshold voltage. The first one of the N comparators has a maximum threshold voltage. The threshold voltages decrease monotonically from No. 1 to No. N. N exclusive-OR components are provided. A first one of the N exclusive-OR components is coupled to ground and to the output of a first one of the N comparators. Each of the remaining N−1 exclusive-OR components is coupled to the outputs of a respectively different pair of the N comparators, so that at any given time, a single one of the N exclusive-OR components has an output signal of a logic level that is different from the logic level of the outputs of the remaining N−1 exclusive-OR components. N resistive divider circuits are coupled to respective ones of the N exclusive-OR components. Each of the N resistive divider circuits provides a respectively different predetermined output voltage as an indication of a power level of the pulse-type signal, if the exclusive-OR component to which that circuit is coupled is the single one of the N exclusive-OR components.

25 Claims, 6 Drawing Sheets

OTHER PUBLICATIONS

Article "How TDMA Works" from The International Engineering Consortium, May 1998.

Article "The Digital Advantage" from The International Engineering Consortium, May 1998.

Article "TDMA Versus CDMA" from The International Engineering Consortium, May 1998.

Article "The Advantages of TDMA" from The International Engineering Consortium, May 1998.

Article "The Disadvantages of TDMA" from The International Engineering Consortium, May 1998.

Article "Advanced TDMA" from The International Engineering Consortium, May 1998.

Article "Hierarchical Cell Relationships" from AT&T Wireless Services Web page, May 1998.

Article "Lucent Technologies uses Commerical Grade Network Equipment to Demonstratenew TDMA Digital Speech Coder", Lucent Technologies, Mar. 1997.

Article "TDMA Technology for Cellular and PCS Wireless Communications", from Isotel Research, May 1998.

* cited by examiner

500

POWER LEVEL DETERMINATION DEVICE IN AN RF BOOSTER FOR WIRELESS COMMUNICATIONS

FIELD OF THE INVENTION

The present invention relates to the field of wireless communications generally, and more specifically to radio frequency (RF) boosters for wireless communications.

DESCRIPTION OF THE RELATED ART

The personal stations of wireless cellular phones are divided into several classes according to the level of RF power they transmit. An RF booster may be included in the "hands-free" communications kit of an automobile to improve wireless communications when a handset (personal station) is placed in holder of the hands-free kit. The RF booster increases the transmitted power of the combination "booster—personal station" above the transmitted power of the personal station itself. The power transmitted by the combination must still remain within defined limits corresponding to a class. This function is performed by the system power control.

An improved power control is desired.

SUMMARY OF THE INVENTION

The present invention is a power level determination device which provides an output voltage usable as a specific reference power level corresponding to each RF input power level.

The device includes a peak detector, which detects a pulse-type signal at its input and provides a non-pulse-type signal at its output.

N comparators are provided, where N is an integer. Each of the N comparators has an output, a first input coupled to the output of the peak detector, and a second input coupled to a respectively different threshold voltage.

N exclusive-OR components are provided. A first one of the N exclusive-OR components is coupled to the output of a first one of the N comparators. Each of the remaining N−1 exclusive-OR components is coupled to the outputs of a respectively different pair of the N comparators, so that at any given time, a single one of the N exclusive-OR components has an output signal of a logic level that is different from the logic level of the outputs of the remaining N−1 exclusive-OR components.

N circuits are coupled to respective ones of the N exclusive-OR components. Each of the N circuits provides a respectively different predetermined output voltage if the exclusive-OR component to which that circuit is coupled is the single one of the N exclusive-OR components, as an indication of a power level of the pulse-type signal.

DETAILED DESCRIPTION

Figure 5:
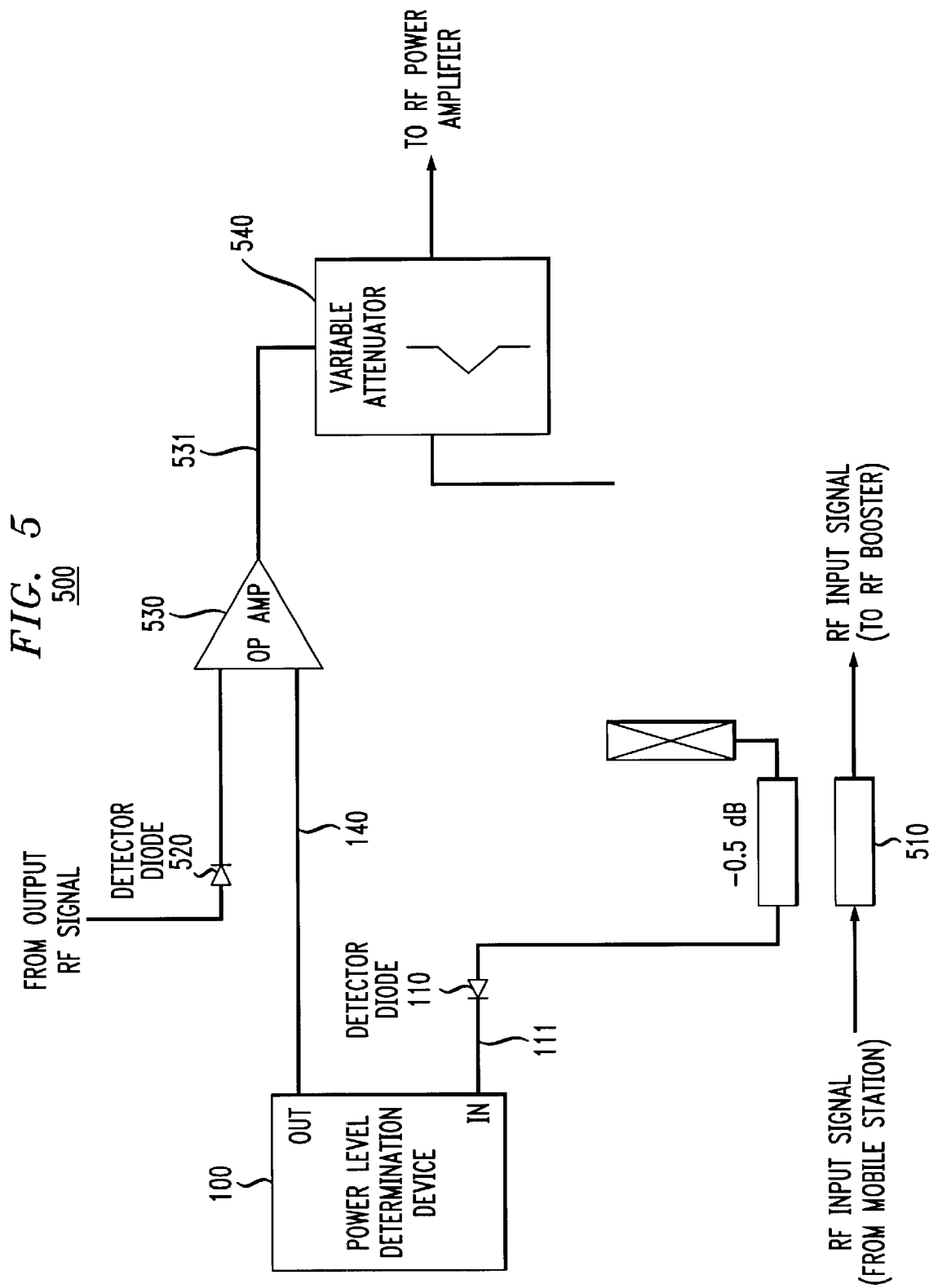
FIG. 5 is a block diagram of an RF power control which includes the power level determination device of FIG. 1A.

FIG. 5 shows a system power control circuit 500 which includes a power level determination device (PLDD) 100 according to the present invention. The PLDD 100 is used to detect the level of RF power 111 at any instant in time and generate a signal 140 corresponding to the nominal value (defined by the IS-136 Time Division Multiple Access standard) of the power level 111 corresponding to the detected level. Each of the standard RF input power levels has a correspondingly different DC value that is provided by PLDD 100. This DC value 140 remains substantially constant throughout the range of each power level 111. According to the IS-136 standard, the highest power level has the number "1" (i.e., as the number increases, the power level decreases; Level 7 is the lowest level).

The RF input signal from the mobile personal station is provided to the RF booster. A directional coupler 510 provides a rectified version 111 of the RF input signal to PLDD 100 via detector diode 110. PLDD 100 provides the standard DC reference value 140 corresponding to the power level 111 received from detector diode 110. The DC value 140 is used as a reference voltage level for input to the OpAmp 530. OpAmp 530 compares the nominal value 140 output from PLDD 100 to the actual value of the Output RF signal rectified by detector diode 520. OpAmp 530 generates and transmits the "signal of the error" 531 to variable attenuator 540, to control the RF power amplifier. This keeps the transmitted RF power closer to the nominal value.

Figure 1A:
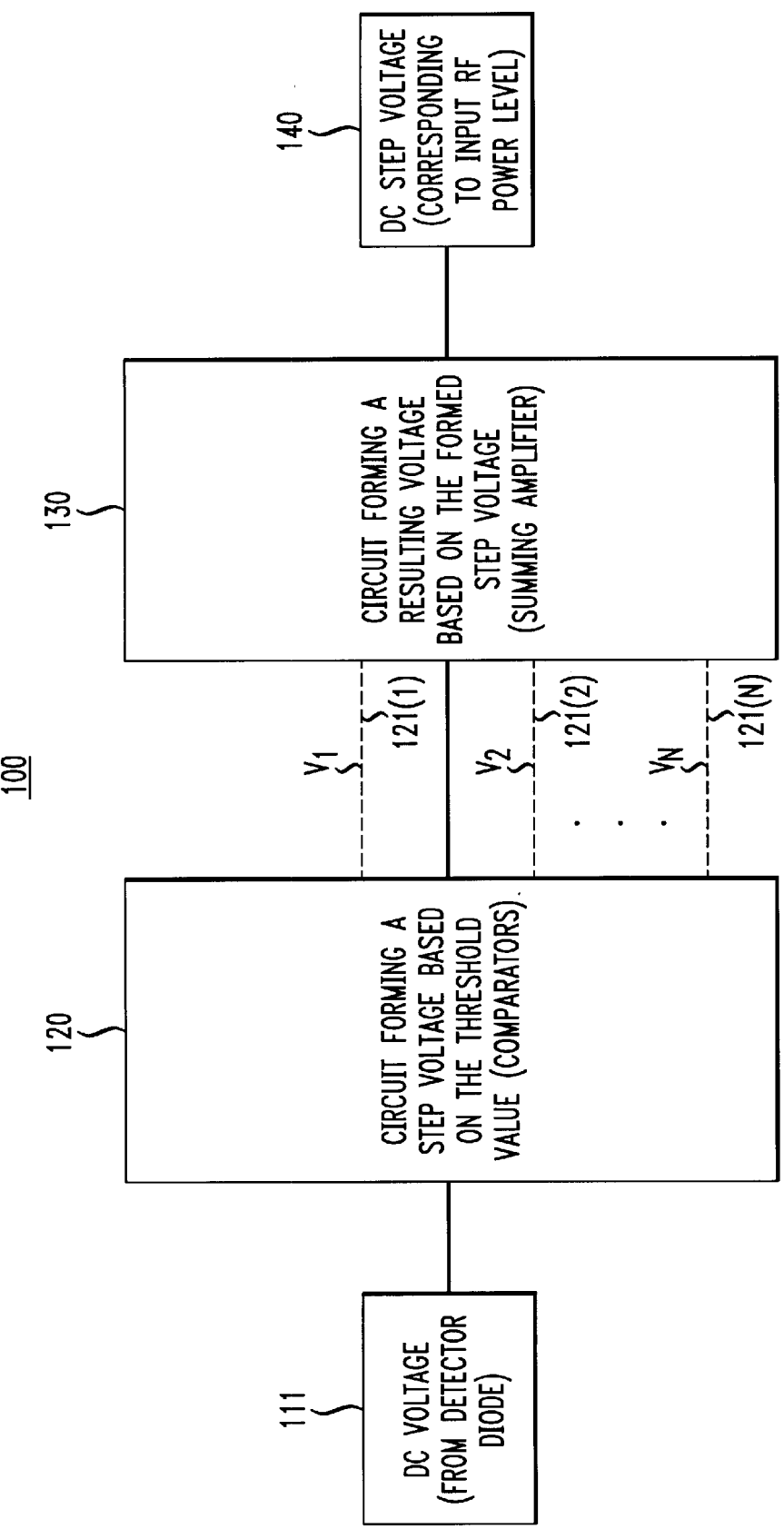
FIG. 1A is a block diagram of an exemplary power level determination device according to the invention.

FIG. 1A is a block diagram of an exemplary PLDD 100. PLDD 100 provides a reference power level 140 for any given input power level 111, and maintains the reference power level 140 substantially constant over each standard range of the power level. Block 120 is a circuit forming a step voltage based on the threshold value. Block 120 determines the power level of input voltage 111, and provides a plurality of values $V_1-V_N$ corresponding to the RF input power levels 111, where N is the number of power levels. Block 120 provides N lines 121(1) to 121(N) to block 130, corresponding to the N power levels. Each of these lines 121(1) to 121(N) is capable of carrying a power level reference signal $V_1-V_N$ which transitions from a zero value to a non-zero value at a different threshold of the input voltage signal 111. Block 130 is a circuit forming a resulting voltage 140 based on the formed step voltages $V_1-V_N$. Block 130 sums the signals from lines 121(1) to 121(N) to form the reference signal 140.

Figure 1B:
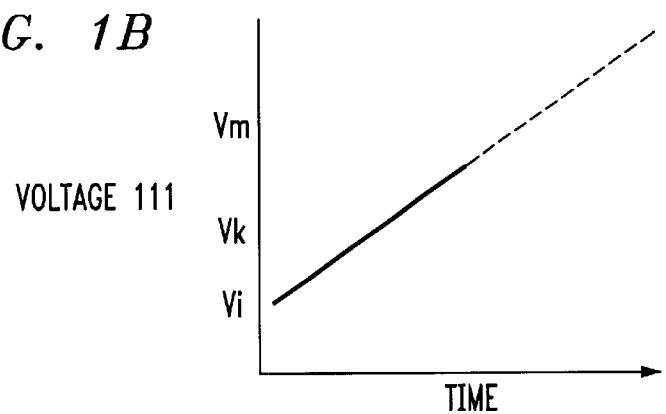
FIG. 1B is a graph showing DC voltage as a function of time at the input node of the device of FIG. 1A.
Figure 1C:
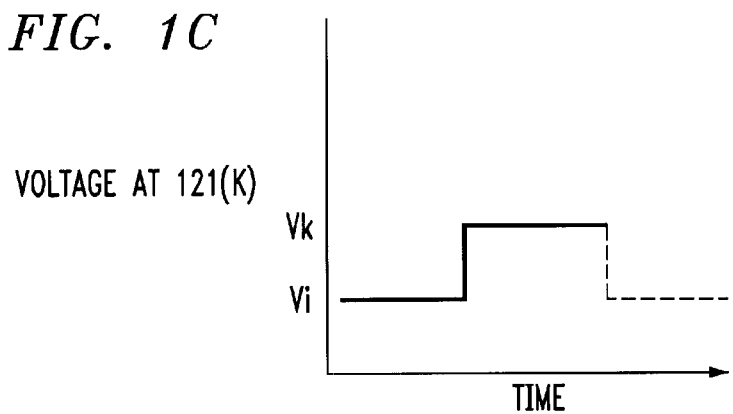
FIG. 1C is a graph showing DC voltage as a function of time for one of the N couplings between the two blocks shown in FIG. 1A.
Figure 1D:
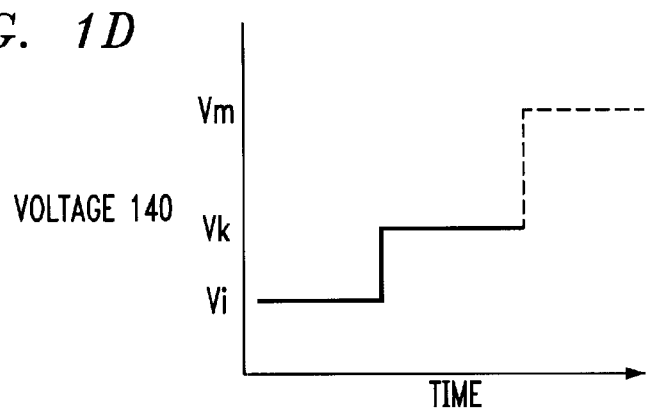
FIG. 1D is a graph showing DC voltage as a function of time at the output node of the device of FIG. 1A.

FIGS. 1B to 1D show the input voltage 111, the individual signals V(1) to V(N), transmitted via lines 121(1) to 121(N), respectively, from block 120 to block 130, and the reference voltage 140 formed by PLDD 100. Each curve is divided into two regions, shown by a solid line and a dashed line, respectively. Reference is first made to the solid-line portions of the curves in FIGS. 1B to 1D, in which $V_I<Vinput<V_K$. The remaining portion of each curve is described further below.

FIG. 1B shows an exemplary incoming RF signal 111 as a function of time. The DC power level of signal 111 may vary continuously. In the solid-line portion of FIG. 1B, the voltage varies between $V_I$ and $V_K$, where $V_M > V_K > V_I$.

FIG. 1C shows an example of signal $V_K$, carried by line 121(K), which is one of the N lines 121(1) to 121(N) connecting block 120 to block 130. The voltage $V_K$ on line 121(K) has a step voltage function. The voltage $V_K$ is zero if the power level of signal 111 is below the minimum threshold associated with line 121(K). The voltage $V_K$ is non-zero if the power level of signal 111 is above the minimum threshold for line 121(K).

FIG. 1D shows the voltage 140 at the output of summing amplifier block 130. At any given input power level 111, the output voltage 140 equals the greatest reference voltage that does not exceed that power level. This sum is formed by adding the voltages V(1) through V(N). Thus, when the signal $V_K$ transitions from zero to non-zero, there is a step in FIG. 1D. The step function of FIG. 1D increases monotonically as a function of the input voltage.

Given the system of FIG. 5 and the PLDD block design shown in FIG. 1A, the inventors have addressed the following issues in the exemplary design:

(1) The DC voltage 111 from the detector diode 110 at lower power levels is small (ones or tens of millivolts). This makes it difficult to compare incoming voltage 111 with threshold levels, which are also small. High sensitivity is usually provided by the amplification of a small signal and subsequent filtration. Nevertheless, high amplification of the input voltage may be undesirable, because of possible voltage clipping at higher power levels.

(2) Filtration is also undesirable. The DC voltage 111 from detector diode 110 is a pulse-type (burst), because of the nature of the TDMA Digital communications, and is converted to a non-pulse-type signal. Nevertheless, filtration causes delay in signal propagation and distortion for the RF signal transmitted from the booster.

(3) The present inventors developed a first implementation of block 120 including a plurality of step functions, each step function providing a value of zero below its respective minimum threshold, and a non-zero value for all values above its minimum threshold. This design could be implemented using a plurality of comparators, each having a respectively different threshold voltage; the outputs of all the comparators would simply be summed. However, simply summing the individual DC voltages associated with each of the power level ranges would create dependence of the resulting voltage on all of the DC voltages that would be summed. This would result in delay and distort the output DC voltage and the RF signal transmitted from the booster.

The inventors have designed an exemplary PLDD 100 that obviates these issues. Rather than generating K non-zero voltage contributions $V_1$ through $V_K$, the exemplary block 120 provides a single non-zero voltage component $V_K$ to the summing amplifier 130. All of the remaining signals $V_1$ through $V_{K-1}$ and $V_{K+1}$ through $V_N$ have values of zero. The voltage $V_K$ is zero if the power level of signal 111 is above the maximum threshold for line 121(K). When $V_K$ returns to zero and $V_{K+1}$ becomes non-zero, there is another step in FIG. 1D.

At any given time, only one of these N inputs, line 121(K), provides a non-zero signal $V_K$. Thus, block 130 forms a single signal 140 having a magnitude corresponding to the single active signal $V_K$ (where K is an integer between 1 and N) transmitted from block 120 to block 130. These functions are described in greater detail below.

An exemplary PLDD 100 is now described with reference to FIGS. 2A, 3 and 4. PLDD 100 includes: (1) a peak detecting means for detecting a pulse-type signal and providing a non-pulse-type signal at its output; (2) a comparing means for comparing the non-pulse-type signal to N respectively different threshold values (where N is an integer), and for determining which ones of the N threshold values are smaller than the non-pulse-type signal; (3) selecting means for selecting the smallest one of the N threshold values which is larger than the non-pulse-type signal; and (4) means for providing a predetermined output voltage associated with the selected threshold value, as an indication of a power level of the pulse-type signal 111. An example of each of these elements is now described.

Figure 2A:
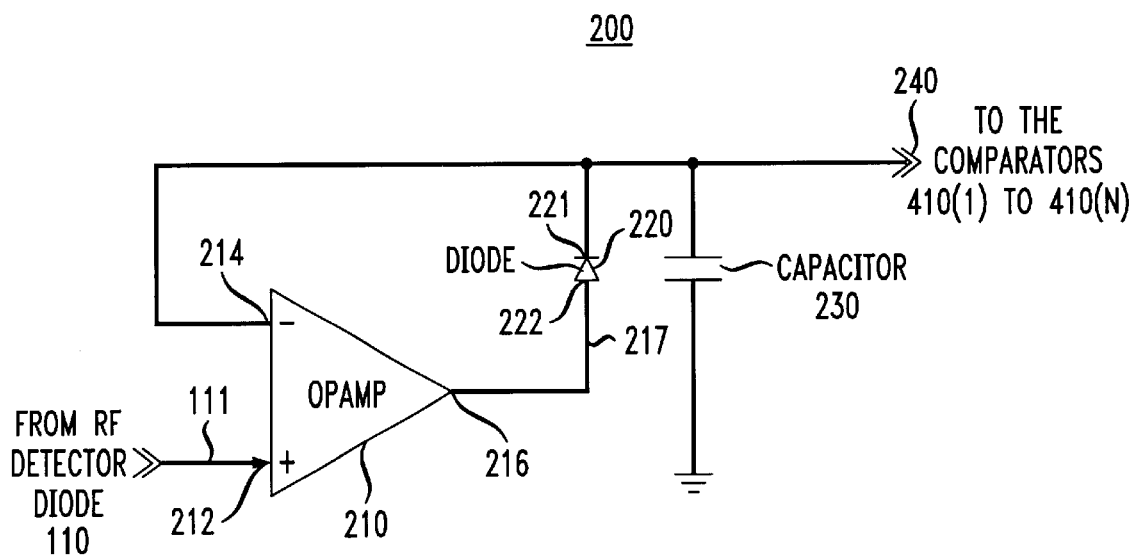
FIG. 2A is a schematic diagram showing an exemplary active peak detector included in the exemplary step voltage forming circuit shown in FIG. 1A.

The peak detecting means may be, for example, an active peak detector 200, as shown in FIG. 2A. The peak detector 200 in turn includes: (a) follower means for functioning as a voltage follower when an input voltage of the follower means has a first sign, and for functioning as an open circuit when an output voltage of the follower means has a second sign opposite the first sign; and (b) waveform smoothing means coupled to receive the output voltage of the follower means, for smoothing the non-pulse-type signal.

The follower means may be, for example, an operational amplifier 210 having a positive input 214, a negative input 212 and an output 216. A diode 220 is placed in the negative feedback path 217 of the op amp 210. The diode 220 may have its anode 222 connected to the output of the amplifier 210 and its cathode 221 connected to both the negative input 214 of the amplifier 210 and the output 240 of the peak detecting means. This results in a peak detector 200 which can be conductive when a positive voltage is applied at the positive input 212 of op amp 210. Exemplary peak detector 200 detects positive RF pulse-type signals. When the sign of the input signal 111 is negative, the diode 220 is not conductive, and the follower means acts as an open circuit.

Figure 4:
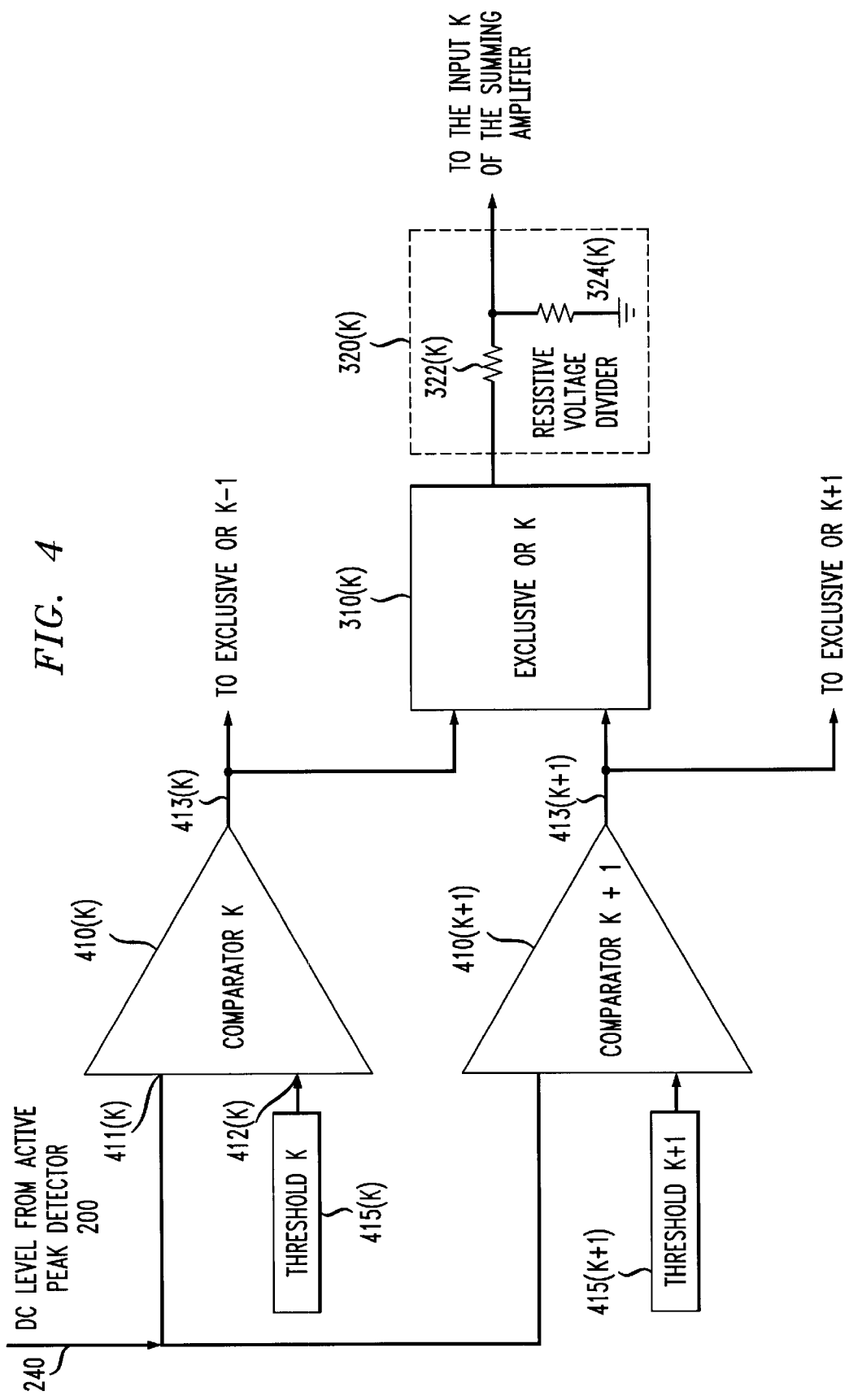
FIG. 4 is a schematic diagram showing a single stage of the 7-to-1 converter shown in FIG. 3.

The output 240 from active peak detector 200 is provided to a set of N comparators 410(1) to 410(N) (shown in FIG. 4). A respective comparator 410(1) to 410(N) is provided for each one of the N power levels.

In the exemplary embodiment, there are seven power levels, which correspond to the levels defined in IS-136 for TDMA.

Referring again to FIG. 2, the exemplary waveform smoothing means may be a capacitor 230 having a first connection to ground, and a second connection to the terminal 221 of the diode 220. The capacitor 230 forms a non-pulse type signal from the pulse-type signal, by storing energy during the pulses, and discharging energy between pulses. The capacitance of capacitor 230 is selected to influence the time constant of the peak detector 200. The time constant of the peak detector also depends on the input impedance of the following stage (i.e., comparators 410(1) to 410(N) shown in FIG. 4).

Active peak detector 200 provides high sensitivity for input DC voltage of a pulse-type (burst) of RF power. Detector 200 provides this function as a voltage follower, without high amplification, and without filtration or delay.

Figure 2B:
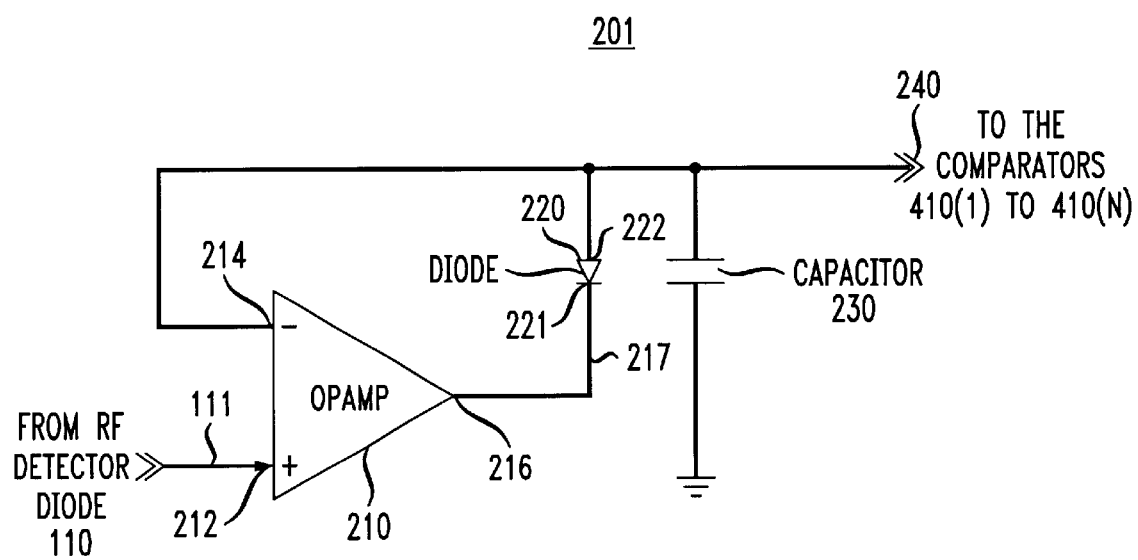
FIG. 2B is a schematic diagram showing an active peak detector included in a variation of the exemplary embodiment.

Although active peak detector 200 is designed to detect positive pulse-type voltages, one of ordinary skill recognizes that a similar active peak detector may also be used for an RF booster having a negative input signal, to detect negative pulse-type input voltages. (i.e., a system in which the detector diode 110 of FIG. 5 has its polarity reversed). FIG. 2B shows an active peak detector 201 for detecting a negative pulse-type input voltage. In peak detector 201, diode 220 has its cathode 221 connected to the output of the amplifier 210 and its anode 222 connected to both the negative input 214 of the amplifier 210 and the output 240 of the peak detecting means 201. The remainder of the description of PLDD 100, below, is directed towards the active peak detector 200, for detecting positive pulse-type input signals.

FIG. 4 shows part of an exemplary comparing means. The comparing means compares the non-pulse-type signal to N respectively different threshold values. The exemplary comparing means includes N comparators 410(1) to 410(N), where N is an integer equal to the number of power levels. Each of the N comparators 410(K), K=1 to N, has an output 413(K), a first input 411(K) coupled to the output 240 of the peak detector 200, and a second input 412(K) coupled to a respectively different threshold voltage 415(K). The threshold voltages 415(1) to 415(N) decrease monotonically from comparator 1 to comparator N. For example, threshold 415(1) may be the minimum voltage threshold of the highest power level, threshold 415(2) may be the minimum voltage threshold of the second power level, and so forth, until threshold 415(7) is the minimum voltage of the lowest power level. One of ordinary skill in the art can readily provide the necessary voltage threshold values by, for example, connecting a constant DC voltage source to a voltage divider having seven resistors in series, the resistors selected to provide the desired thresholds.

Assume that the comparator 410(K) has the lowest threshold voltage 415(K) that is higher than the DC level 240 received from peak detector 200. In operation, when the non-pulse-type output signal 240 of peak detector 200 is provided to comparators 410(1) to 410(N), the comparators 410(1) to 410(K−1) have thresholds above the input signal DC level 240; these comparators have the output signal value of zero. The comparators 410(K) to 410(N) have thresholds below the input signal DC level 240; these comparators have non-zero output signals 413(K) to 413(N), which correspond to logic level HIGH. In summary, K−1 of the N comparators have logic level LOW, and (N−K+1) of the comparators have the logic level HIGH.

The voltage dividers 320 are arranged so as to provide voltages in a decreasing order, corresponding to the decreasing voltage thresholds.

As shown in FIG. 4, the outputs of comparators 410(1) to 410(N) are provided to exclusive OR devices 310(1) to 310(N), respectively. The outputs of comparator 410(K), (K=1 to N−1), are also provided to Exclusive-OR device 310(K+1). Exclusive-OR device 310(1) has one input coupled to the output of comparator 410(1) (having the maximum threshold for detecting the highest power level), and the other input coupled to ground (as shown in FIG. 3). Each Exclusive-OR device 310(1) to 310(N) provides an output signal to a respective resistive voltage divider 320(1) to 320(N).

Figure 3:
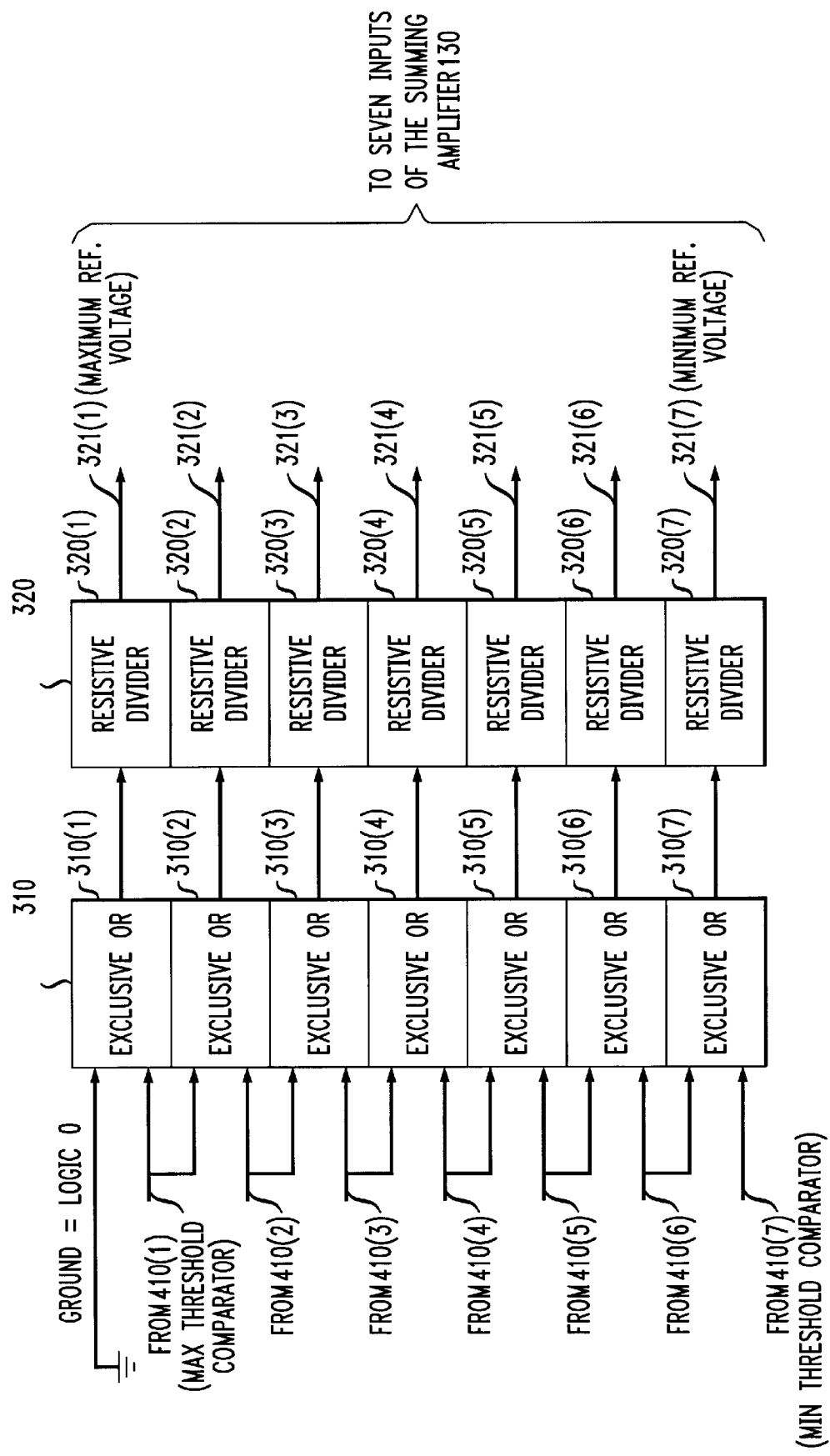
FIG. 3 is a block diagram of an exemplary "7-to-1 converter" suitable for use in the exemplary step voltage forming circuit shown in FIG. 1A.

FIG. 3 shows the selecting means for selecting the lowest one of the N threshold values which is higher than the non-pulse-type signal. The selecting means may, for example, include N two-input exclusive-OR components 310. Exclusive-OR component 310(1) is coupled to ground and to the output of comparator 410(1). Exclusive-OR components 310(2) through 310(7) are each coupled to a respectively different pair of the N comparators.

FIG. 3 shows the network 300 of Exclusive OR devices 310 and resistive dividers 320. This network 300 is hereinafter referred to as an "N-to-1 converter," or, for the exemplary embodiment, a "7-to-1 converter." 7-to-1 converter 300 is coupled to ground, and to the outputs 413(1) to 413(7) of comparators 410(1) to 410(7), respectively.

At any given time, a single one of the N exclusive-OR components has an output signal of a logic level that is different from the logic level of the outputs of the remaining N−1 exclusive-OR components. If both of the inputs to an exclusive-OR device are in the logic-HIGH state, or if both inputs to the exclusive-OR device are in the logic-LOW state, the output of the exclusive-OR device is in the logic-LOW state. If one of the inputs is logic-LOW and the other input is logic-HIGH, then the output of the exclusive-OR device is logic-HIGH.

Because comparators 410(1) to 410(N) are coupled to monotonically decreasing threshold voltages, the comparators are always divided into two groups, such that comparators 410(N) to 410(K) are in the logic-HIGH state, and comparators 410(K−1) through 410(1) are in the logic-LOW state. Thus, exclusive-OR devices 310(N) to 310(K+1) have two logic-HIGH inputs, and provide an output that is logic, LOW. Exclusive-OR device 310(K) has one logic-HIGH input and one logic-LOW input, and provides a logic-HIGH output. Exclusive-OR devices 310(K−1) to 310(1) have two logic-LOW inputs, and provide an output that is logic-LOW. Only exclusive-OR device 310(K) provides a logic-HIGH output to its corresponding voltage divider 320(K).

Each resistive divider circuit 320(K) has a respectively different ratio between the resistances of resistors 322(K) and 324(K). Thus, if each Exclusive OR device 310(K) provides the same voltage in a logic-HIGH state, the output of each divider circuit 320 is different from the others.

The resistive divider circuits 320(1) to 320(N) each have a different dividing coefficient. If exclusive-OR device 310 (K) is the only exclusive-OR device in the logic-HIGH state, then resistive divider 320(K) is the only resistive divider having a non-zero output signal. All of the other resistive dividers 320(1) to 320(K−1) and 320(K+1) to 320(N) have output values of zero. Thus, when the outputs from all of the resistive divider circuits 320(1) to 320(N) are summed in the summing amplifier 130 (FIG. 1A), the sum is equal to the output voltage of the single resistive divider 320(K) having the non-zero output.

One of ordinary skill in the art recognizes that any number of power levels N may be accommodated by providing N comparators, N exclusive-OR devices, and N resistive dividers.

The exemplary PLDD 100 provides a nominal DC voltage for every RF power level, independently. Each DC level is formed independently from the other DC levels, providing precise and stable output. Because the output of the summing amplifier 130 only depends on a single resistive divider, distortion is reduced.

A PLDD 100 according to the invention provides high sensitivity for input DC voltage at low pulse-type (burst) of RF power. The invention generates precise DC levels within a short rise time for every burst of RF transmission. The parameters of the transmitted RF signal are increased, which may improve the wireless call reliability and voice quality.

Although the invention has been described in terms of exemplary embodiments, it is not limited thereto. Rather, the appended claim should be construed broadly, to indicate other variants and embodiments of the invention which may be made by those skilled in the art without departing from the scope and range of equivalents of the invention.

What is claimed is:

1. A power level determination device, comprising:
   a peak detector, which detects a pulse-type signal at an input thereof and provides a non-pulse-type signal at an output thereof;

N comparators, where N is an integer, each of the N comparators having an output, a first input coupled to the output of the peak detector, and a second input coupled to a respectively different threshold voltage;

N exclusive-OR components, a first one of the N exclusive-OR components being coupled to ground and to the output of a first one of the N comparators, each of the remaining N−1 exclusive-OR components being coupled to the outputs of a respectively different pair of the N comparators, so that at any given time, a single one of the N exclusive-OR components has an output signal of a logic level that is different from the logic level of the outputs of the remaining N−1 exclusive-OR components; and N circuits coupled to respective ones of the N exclusive-OR components, each of the N circuits providing a respectively different predetermined analog output voltage that is independent of the respective threshold voltage corresponding to that one of the N circuits, if the exclusive-OR component to which that circuit is coupled is the single one of the N exclusive-OR components, as an indication of a power level of the pulse-type signal.

2. A device according to claim 1, wherein the first one of the exclusive-OR devices has a first input coupled to ground and a second input coupled to a first one of the N comparators, the first one of the N comparators having a maximum threshold voltage.

3. A device according to claim 2, wherein the $k^{th}$ exclusive-OR device has a first input coupled to the output of the $k-1^{th}$ comparator and a second input coupled to the output of the $k^{th}$ comparator, where k is an integer between 2 and N.

4. A device according to claim 3, wherein the threshold voltages of the N comparators increase monotonically from comparator 1 to comparator N.

5. A device according to claim 1, wherein each of the N circuits is a resistive divider circuit.

6. A device according to claim 1, wherein:
the peak detector includes an active circuit which has an input voltage and an output voltage, and
the active circuit functions as a voltage follower when the input voltage has a first sign that can make the active circuit conductive, and as an open circuit when the output voltage has a second sign opposite the first sign.

7. A device according to claim 1, wherein the peak detector comprises:
an amplifier having a positive input, a negative input and an output;
a diode having a first terminal connected to the output of the amplifier and second terminal connected to both the negative input of the amplifier and the output of the peak detector; and
a capacitor having a first connection to ground, and a second connection to the second terminal of the diode.

8. A device according to claim 7, wherein the first terminal of the diode is a cathode and the second terminal of the diode is an anode, whereby the peak detector senses negative pulses.

9. A device according to claim 7, wherein the first terminal of the diode is an anode and the second terminal of the diode is a cathode, whereby the peak detector senses positive pulses.

10. A device according to claim 7, wherein the positive input to the amplifier receives the pulse-type signal from a radio frequency detector diode.

11. A device according to claim 1, wherein each of the N circuits is a voltage divider.

12. The device of claim 1, further comprising means for outputting the analog output voltage to an input for a radio frequency booster.

13. The device of claim 1, wherein each of the N circuits provides a respectively different predetermined analog output voltage having a respective standard TDMA power level.

14. The device of claim 13, wherein each standard TDMA power level is defined by international standard IS-136.

15. The device of claim 1, wherein the analog output voltages are independent of each other.

16. A power level determination device, comprising:
peak detecting means for detecting a pulse-type signal and providing a non-pulse-type signal at an output thereof;
comparing means for comparing the non-pulse-type signal to N respectively different threshold values, where N is an integer, and for determining which ones of the N threshold values are smaller than the non-pulse-type signal;
selecting means for selecting the smallest one of the N threshold values which is larger than the non-pulse-type signal; and
means for providing a predetermined analog output voltage associated with the selected threshold value that is independent of the respective N threshold values, as an indication of a power level of the pulse-type signal.

17. A device according to claim 16, wherein the peak detecting means comprises:
follower means for functioning as a voltage follower when an input voltage of the follower means has a first sign, and for functioning as an open circuit when an output voltage of the follower means has a second sign opposite the first sign; and
waveform smoothing means coupled to receive the output voltage of the follower means, for smoothing non-pulse-type signal.

18. A device according to claim 16, wherein the peak detecting means comprises:
an amplifier having a positive input, a negative input and an output;
a diode having a first terminal connected to the output of the amplifier and a second terminal connected to both the negative input of the amplifier and the output of the peak detecting means; and
a capacitor having a first connection to ground, and a second connection to the second terminal of the diode.

19. A device according to claim 18, wherein the first terminal of the diode is a cathode and the second terminal of the diode is an anode, whereby the peak detecting means senses negative pulses.

20. A device according to claim 16, wherein the comparing means comprises N comparators, where N is an integer, each of the N comparators having an output, a first input coupled to an output of the peak detecting means, and a second input coupled to a respectively different threshold voltage.

21. A device according to claim 16, wherein the selecting means comprises N exclusive-OR components, each being coupled to the outputs of either a respectively different one of the N comparators or a respectively different pair of the N comparators, so that at any given time, a single one of the N exclusive-OR components has an output signal of a logic level that is different from the logic level of the outputs of the remaining N−1 exclusive-OR components.

22. A device according to claim 16, wherein the predetermined output voltage providing means comprises a plurality of voltage dividers.

23. The device of claim 16, wherein the analog output voltages are independent of each other.

24. A power level determination device, comprising:

a peak detector, which detects a pulse-type signal at an input thereof and provides a non-pulse-type signal at an output thereof;

N comparators, numbered 1 through N, where N is an integer, each of the N comparators having an output, a first input coupled to the output of the peak detector, and a second input coupled to a respectively different threshold voltage, the threshold voltages of the N comparators decreasing monotonically from comparator 1 to comparator N;

N exclusive-OR components, numbered 1 through N, a first one of the N exclusive-OR components being coupled to ground and to the output of a first one of the N comparators, each of the remaining N−1 exclusive-OR components numbered 2 through N being coupled to the outputs of a respectively different pair of the N comparators including the k−$1^{th}$ comparator and the k$^{th}$ comparator, for k=2 to N, so that at any given time, a single one of the N exclusive-OR components has an output signal of a logic level that is different from the logic level of the outputs of the remaining N−1 exclusive-OR components; and N circuits coupled to respective ones of the N exclusive-OR components, each of the N circuits providing a respectively different predetermined analog output voltage that is independent of the respective threshold voltage corresponding to that one of the N circuits, if the exclusive-OR component to which that circuit is coupled is the single one of the N exclusive-OR components, as an indication of a power level of the pulse-type signal.

25. The device of claim 24, wherein the analog output voltages are independent of each other.

* * * * *